(12) United States Patent
Busch

(10) Patent No.: US 7,174,522 B2
(45) Date of Patent: Feb. 6, 2007

(54) METHOD AND DEVICE FOR CIRCUIT VERIFICATION

(75) Inventor: Holger Busch, Brunnthal-Otterloh (DE)

(73) Assignee: Onespin Solutions GmbH, Munich (DE)

( * ) Notice: Subject to any disclaimer, the term of this patent is extended or adjusted under 35 U.S.C. 154(b) by 85 days.

(21) Appl. No.: 10/901,558

(22) Filed: Jul. 29, 2004

(65) Prior Publication Data
US 2005/0044516 A1 Feb. 24, 2005

(30) Foreign Application Priority Data
Jul. 30, 2003 (DE) ............... 103 34 767

(51) Int. Cl.
*G06F 17/50* (2006.01)
(52) U.S. Cl. .................. 716/5; 716/2; 716/4
(58) Field of Classification Search .......... 716/5–6, 716/2, 4
See application file for complete search history.

(56) References Cited

U.S. PATENT DOCUMENTS 6,449,752 B1 * 9/2002 Baumgartner et al. ......... 716/5

2003/0110455 A1 6/2003 Baumgartner et al.

\* cited by examiner

*Primary Examiner*—Stacy A Whitmore
(74) *Attorney, Agent, or Firm*—Brinks Hofer Gilson & Lione

(57) ABSTRACT

When designing digital circuits, the specification of the circuit is used to formulate properties and to check the applicability thereof using a model of the circuit. A verifier is employed and uses the model to determine whether a property is applicable by seeking a counterexample to which the property does not apply. Any counterexample appearing is evaluated to determine whether it is caused by a defective model or whether it should have been avoided by reformulating the property within the scope of the specification. Which exact part of the property led to the counterexample is determined when one appears. If a plurality of times is possible for a part of the property, the instant(s) at which specific events in the parts of the property lead to the counterexample is determined. A developer can evaluate the counterexample much more quickly using this information, so the development process can be accelerated.

24 Claims, 1 Drawing Sheet

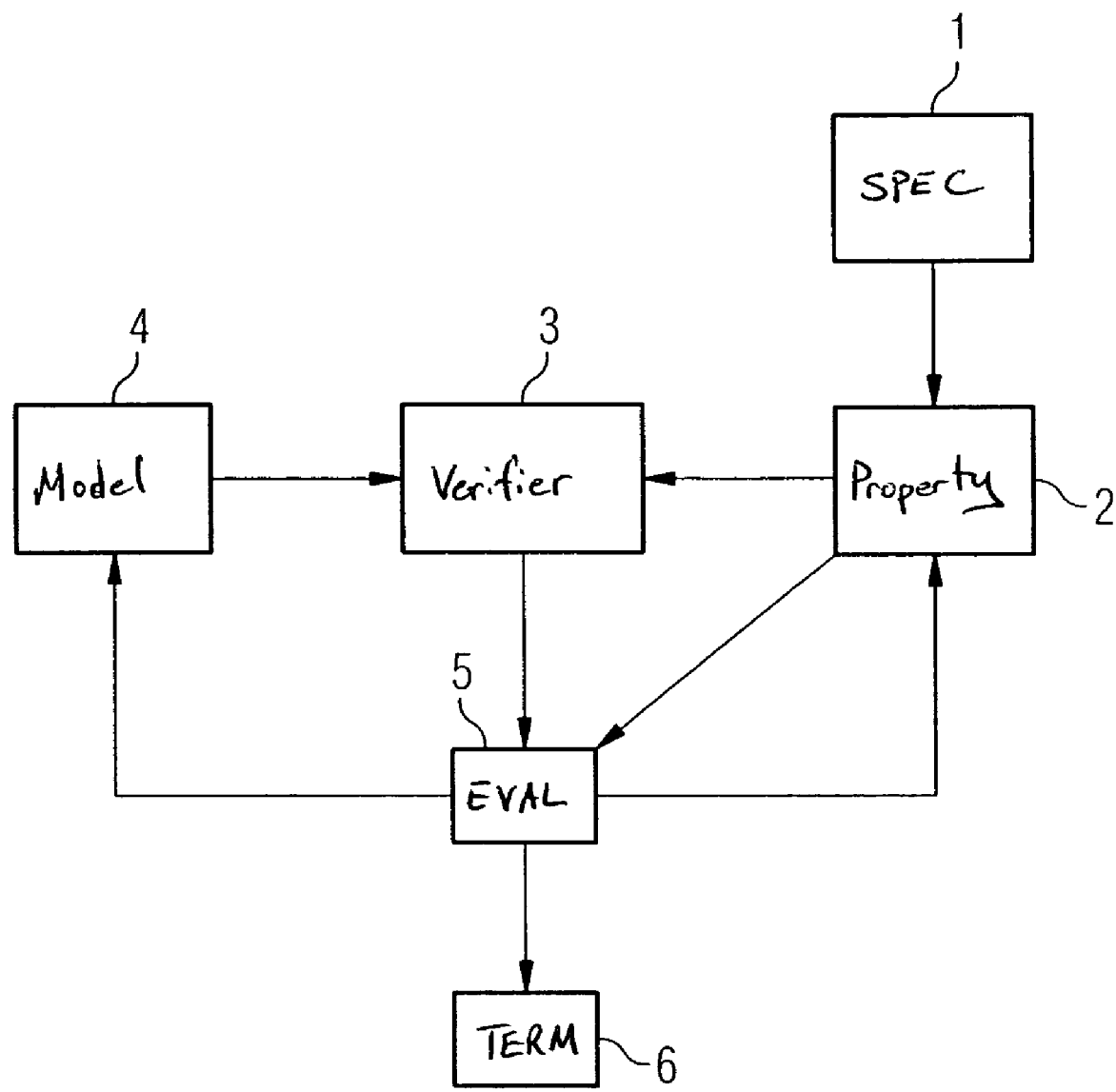

METHOD AND DEVICE FOR CIRCUIT VERIFICATION

This application claims the benefit of priority to DE 103 34 767.4 filed Jul. 30, 2003, herein incorporated by reference in its entirety.

BACKGROUND

1. Related Field

The following invention relates to a method and a device configured for carrying out the method for verifying a digital circuit using a model of the circuit and at least one required property of the circuit, and to a digital storage medium with control signals for carrying out the method using a data processing device.

2. Description of the Related Art

As defined herein, a property has an assumption and an assertion. A property is applicable and the circuit possesses this property if, in the presence of the assumption, the assertion occurs or is applicable, both the assumption and the assertion of the property being descriptions of the state of the circuit, in particular while accounting for the time or relative time references. A circuit description of this type does not necessarily provide a complete description of the state of the circuit, but comprises individual state ratings. A state rating of this type can establish, for example, the logic state of a signal line within the circuit, the content of a register or a relationship between a plurality of signals. State descriptions will generally reproduce the state of only a few parts of the circuit.

As a constituent of a property, a state description generally also possesses a time component, so a circuit state is determined not only at a specific instant but also over a specific number of increments in time or over a specific period of time. It can be used to determine, in particular, changes in logic states of specific signals or of a register content together with the timing thereof relevant to other events.

A description of the circuit, which is abstract and generally describes fewer details than the complete circuit design at gate level, is basically produced when defining such properties.

Furthermore, the assumption and assertion of a property are generally in a fixed time relationship with one another so the changes of state defined by the assertion of a property appear with time definition with respect to the changes of state in the corresponding assumption, if the property is applicable. The time ranges spanned by the assumption and the assertion of a property can also overlap, the entire time frame spanned by a property also being designated as the interval of the property.

The assumption and the assertion of a property may be defined by terms from the ITL (interval temporal logic). An identifier for a specific instant which is, for example, t can be introduced into a property as a time reference point. Individual states or changes of state may then be described with respect to this instant, the relative position, in particular, being expressed by means of time increments. For example, an instant which is five time increments behind the reference instant can be identified by t+5.

Moreover, a different time reference system may also be defined within a property, by introducing a further identifier, which is placed in a temporal relationship with the first-mentioned identifier of the instant. This reference can also include a specific interval, so there is a plurality of options for the temporal relationship between the two instants. This is advantageous, for example, in cases where a change in the state of the property is not required at a specific instant, but only the appearance of the change in state within a specific time interval which, in turn, is in a temporal relationship with a further change of state or event.

When verifying a digital circuit using the model circuit and at least one required property, the model circuit is used to check whether the required property is or is not applicable in that an counterexample is sought, which is a concrete description of the state of the circuit and in which the assertion does not apply. To enable this statement to be made, the counterexample fulfils the assumption, so a statement about the property can be made in any case and a contradiction between the counterexample and the assertion appears. This means that the assertion is incompatible with the state description supplied by the counterexample. If a counterexample appears during development of the circuit, it must then be checked whether it is due to the inadequate formulation of the property or whether the circuit design needs to be changed. It is frequently due to inadequate formulation of the property owing, in particular, to the fact that attainability was not analysed during the check for reasons of cost and practicability. This means that the properties have sometimes also been checked on the basis of circuit states which cannot appear in practice or at least should not appear, and these irrelevant states have then led to a counterexample or to the inapplicability of the property. The counterexamples found in such cases are irrelevant as the triggering states do not have to be taken into consideration in practice. A further reason for irrelevant counterexamples may also be that environmental influences from other parts of the circuit, which are being investigated separately, for example, have not been taken into consideration. Therefore, it is basically necessary, when developing a digital circuit by the above-described method, to check the applicability of a property and, on appearance of a counterexample, to investigate the reason for the appearance of the counterexample and possibly to change the property.

SUMMARY

Accordingly, a method and a device of the type mentioned at the outset are provided, configured for carrying out the method, as well as a digital storage medium with control instructions, which is configured to carry out the method in conjunction with a programmable data processing device, and with which the development of a digital circuit may be simplified using a model of the circuit and at least one required property.

According to one embodiment of the invention, on appearance of a counterexample, it is determined which part of the assertion led to the counterexample found or which part of the assertion contradicts the counterexample found. This information allows much better analysis of the property. For example, it may thus be determined whether the counterexample has been attained from its state of the circuit, which is unattainable in normal operation and therefore need not be taken into consideration. As these cases frequently occur in practice, the development of a digital circuit can be considerably accelerated, as the property can be adapted faster using the information about the exact part of the property which led to the counterexample. This process is frequently run through repeatedly during development until no counterexample is ultimately found and the applicability of the property is proven or a counterexample found does not originate from an unattainable starting state and thus necessitate a change in the circuit or in environmental variables.

Previously, the counterexample found was formerly shown exclusively in the form of the signal characteristics. Although signal characteristics may be used to establish which signal was crucial for the formation of the counterexample, this information is of little use in interpreting the counterexample. However, presently the counterexample is advantageously also shown in the form of signal characteristics in the embodiment described so that this information can also be displayed to a developer.

The embodiment described herein is advantageously used in formal circuit verification, during which the applicability or inapplicability of individual properties is checked by a formal checker using a model circuit. This formal verification can also be used to establish, with comparatively slight computation effort even in extensive circuits, whether or not a property applies. The embodiment is advantageously also used in verification methods in which attainability is not analysed, which means that circuit states which are not attainable in practice are also taken into consideration, but provides the only option for also being able to check extensive circuits using reasonably slight computation effort. Counterexamples which have to be analysed necessarily appear more frequently, so the present embodiment allows a pronounced acceleration of such a development procedure.

In addition, it is however also possible to check the applicability of the property by simulation.

In most cases, the assertion and/or the assumption of the property is dependent on time. There is a plurality of temporal options, so a specific event can occur at different instants in the assertion or in the assumption and allows the property to decide the exact instant at which the event occurs. In such a case, the embodiment allows not only the respective part of the property which led to the counterexample, but also the exact instant or instants when the occurrence of the event led to the counterexample, to be displayed. The information as to whether a counterexample would basically be reached at any instants or only at specific instants, when there were a plurality of temporal options within a part of the property, can therefore be provided.

The determined part of the assertion which led to the counterexample is advantageously displayed, and can advantageously be displayed together with the complete assertion, so the evaluation is simplified for a developer.

In addition, state expressions, together with the respectively associated evaluations calculated by the signal occupancy of the counterexample determined by the verifier, can be displayed in the property. Thus, for example, arithmetical evaluations can be made, the truth value of higher-ranking constituents of a property depending on the results thereof. The user can use the displayed evaluations to obtain a more accurate picture of the relationships between the signal values.

The embodiment may be adopted in cases where macros combining individual parts of the property have been used in formulation of the property.

The method may be carried out, in particular, in a data processing device, such as a programmable computer, also being implementable in a data carrier with suitable control statements and the control statements being configured in such a way that a correspondingly configured programmable data processing device carries out the method once the control statements have been read in.

BRIEF DESCRIPTION OF THE DRAWING

The FIGURE is a flow chart of the activities during the development according to the invention of a digital circuit.

DETAILED DESCRIPTION

The invention will be described in more detail by means of an embodiment with reference to the accompanying drawing.

The single FIGURE is a flow chart showing the verification of a digital circuit. It comprises, on the one hand, a model 4 of the digital circuit and, on the other hand, a specification (SPEC) 1. The specification 1 defines the behaviour of the digital circuit by means of properties 2, in particular also as a function of external influences or input signals.

One tool in checking is a verifier 3, which checks whether or not a specific property applies to a specific model 4 of the digital circuit. This may be a simulator, which employs simulation, or a formal checker 3, which does not employ simulation but formal mathematical methods. As the result of this check, the verifier 3 delivers a counterexample if a specific property 2 in the model 4 is not applicable.

The result of the verifier 3 is evaluated in an evaluation 5. This checks whether the verifier 3 has found a counterexample and analyses the counterexample if a counterexample is found. If the evaluation (EVAL) 5 shows that the verifier 3 has not found a counterexample for any of the properties 2 or the model 4 comprises all properties 2, the verification procedure can be terminated (TERM) 6.

If a counterexample is found, it is distinguished whether the presence of the counterexample is due to inadequate formulation of the property 2 or due to the model 4.

It is difficult to check whether the appearance of a counterexample is due to the model 4 or to a property 2, and precise analysis of the counterexample and the reason why this counterexample has been produced is desired. Before the reason for the counterexample is sought in the model 4, the possibility that the counterexample is not caused by inadequate formulation of a property 2 or an environmental influence, which has not been considered, is first ruled out. The reason for the counterexample can be sought in the model 4 and the model 4 be changed, if desired, once these reasons have been ruled out.

This analysis as to whether the counterexample can be prevented from appearing by a change in a property 2, for example to allow for an environmental influence, generally is repeated very often and therefore represents a very high cost in the development or verification of a digital circuit. The environmental influences which are possibly not considered may be, for example, interactions with other parts of the circuit or influences of components external to the circuit. A circuit which is to be developed or verified is often, in practice, divided into individual circuit parts, in order to distribute the processing effort or make it clearer. This division and the resultant interfaces between the circuit parts can also lead to cases where a counterexample is produced because the interfaces have not been correctly allowed for, even though the circuit model 4 is correct. In this case, the unconsidered influence of other circuit parts has to be incorporated into the corresponding properties 2 on appearance of the counterexample, in order to avoid this irrelevant counterexample.

In the present embodiment, the properties 2 are defined by means of the logic language ITL (interval temporal logic), which possesses three basic time operators with which reactions or, generally, events can be defined in relation to the time. It is possible to define whether an event occurred at a specific instant, for a specific period or within a specific period. Otherwise, Boolean operations of logic states of individual signals are obviously also allowable. Furthermore, instants or time intervals which are related to one another and/or to a global time scale can be defined in a property 2. Moreover, each property 2 comprises an assumption and an assertion. The assumption describes a specific circuit state or a specific change in the circuit state over time. The assertion similarly describes a circuit state or a change in the circuit state over time, the assertion of the property 2 occurring when the property 2 is encountered in the presence of the assumption of the property 2.

In complex circuits, both the assumption and the assertion of the property 2 are generally extensive collections of individual details and parts which relate to individual parts of the modulated circuit and, in particular, individual signals or signal groups.

Macros in which parts of properties are combined for the sake of clarity, to make the property 2 clearer, can also be used.

On appearance of a counterexample in the evaluation 5, the result is investigated as a function of the property 2 at which the check produced the counterexample, to ascertain which exact part of the property 2 was responsible for the formation of the counterexample. If the property 2 allows a plurality of time options for individual property parts, the instant(s) at which a specific event led to the counterexample is (are) also determined.

With the verification method, each property 2 is checked by the verifier 3 using the model 4. For each property 2, it is determined whether a counterexample can be determined and the property is subjected to further investigation if desired. If a counterexample is found, it is investigated to ascertain which part of the fundamental property 2 was responsible for the appearance of the counterexample and, in the case of a plurality of possible instants, it is additionally determined at what instants specific events led to the counterexample. This information is displayed together with the fundamental property 2, the property 2 preferably being displayed in text form and the determined parts of the property 2 preferably being highlighted graphically. The parts can be backed, for example, with a different background colour and/or the respective parts can be shown in a different font.

In addition, the counterexample found is shown in the form of signal characteristics, the signals and sometimes also the instants which were used in the appearance of the counterexample also are highlighted here. With the aid of this information, a developer can now decide, in the evaluation 5, whether the appearance of the counterexample was actually triggered by an error in the model 4 or whether it is possibly due to the property 2. This evaluation is significantly accelerated by the information as to which exact part in the property 2 led to the counterexamples. If the appearance of the counterexample does not actually inevitably originate from an error in the model 4, the developer can modify the property 2 accordingly and carry out verification one more time. In the process, it is also possible to determine whether or not the counterexample would still appear with a modified property 2. The property 2 and the determined part of the property 2, which led to the counterexample, and a change in the property 2 input by the developer are used to determine whether or not the counterexample would appear with the correspondingly changed property 2. In this way, the developer can quickly check whether or not the counterexample is still appearing with a specific change in the property 2, so verification with the verifier 3 can be omitted for the time being.

All the aforementioned steps may be carried out by a data processing system. The method may be implemented in a fixed manner in the data processing system or can be loaded as a program. In the latter case, a data processing system for general use such as a workstation or a personal computer on which a corresponding program for carrying out the method is initiated can be used.

The invention claimed is:

1. A method of verifying a digital circuit using a model of the circuit and at least one required property of the circuit, which indicates whether, in the presence of an assumption of the property, an assertion of the property is applicable, the assumption and the assertion describing behavior of the circuit, with which applicability of the property is checked in that at least one counterexample to the at least one property is sought, the counterexample describing the behavior of the circuit and contradicting the assertion, wherein, on appearance of the counterexample, it is determined which part of the assertion contradicts the counterexample found.

2. The method according to claim 1, wherein the applicability of the property is checked by a formal checker.

3. The method according to claim 1, wherein the applicability of the property is checked by simulation.

4. The method according to claim 1, wherein at least one of the assertion and the assumption of the property describes the behavior of the circuit as a function of time, changes in a state of the circuit being able to appear at different times, and, on appearance of the counterexample, instants at which changes in a state of the property contradicts the assertion are determined.

5. The method according to claim 4, wherein the determined instants together with the assumption of the property are displayed.

6. The method according to claim 1, wherein the determined part of the assertion that contradicts the counterexample is displayed together with the property.

7. The method according to claim 1, wherein evaluations of state expressions are displayed directly at a corresponding point within the property at any desired syntactical hierarchical level of properties.

8. The method according to claim 1, wherein at least one of the assumption and the assertion of the property comprises at least one macro in which descriptions of the behavior of the circuit are assembled.

9. An apparatus for verifying a digital circuit using a model of the circuit and at least one required property of the circuit which indicates whether, in the presence of an assumption of the property, an assertion of the property is applicable, the assumption and the assertion describing behavior of the circuit, the apparatus comprising one or more data processing devices which are configured such that the one or more data processing devices check applicability of the property by seeking at least one counterexample to the at least one property, the counterexample describing the behavior of the circuit and contradicting the assertion, and, on appearance of the counterexample, the one or more data processing devices determine which part of the assertion is contradicted by the counterexample found.

10. The apparatus according to claim 9, wherein the one or more data processing devices comprise a formal checker that checks the applicability of the property.

11. The apparatus according to claim 9, wherein the one or more data processing devices check the applicability of the property by simulation.

12. The apparatus according to claim 9, wherein at least one of the assertion and the assumption of the property describes the behavior of the circuit as a function of time, changes in a state of the circuit being able to appear at different times, and, on appearance of the counterexample, instants at which changes in a state of the property contradicts the assertion are determined.

13. The apparatus according to claim 12, further comprising a display that displays the determined instants together with the assumption of the property.

14. The apparatus according to claim 9, further comprising a display that displays the determined part of the assertion that contradicts the counterexample together with the property.

15. The apparatus according to claim 9, further comprising a display that displays evaluations of state expressions directly at a corresponding point within the property at any desired syntactical hierarchical level of properties.

16. The apparatus according to claim 9, wherein at least one of the assumption and the assertion of the property comprises at least one macro in which descriptions of the behavior of the circuit are assembled.

17. A digital storage medium comprising control signals which can be read out electronically and are able to cooperate with a programmable computer device such that the computer device performs a method of verifying a digital circuit using a model of the circuit and at least one required property of the circuit, which indicates whether, in the presence of an assumption of the property, an assertion of the property is applicable, the assumption and the assertion describing behavior of the circuit, with which applicability of the property is checked in that at least one counterexample to the at least one property is sought, the counterexample describing the behavior of the circuit and contradicting the assertion, wherein, on appearance of the counterexample, it is determined which part of the assertion contradicts the counterexample found.

18. The digital storage medium according to claim 17, wherein the control signals include signals that permit the computer device to perform a method in which the applicability of the property is checked by a formal checker.

19. The digital storage medium according to claim 17, wherein the control signals include signals that permit the computer device to perform a method in which the applicability of the property is checked by simulation.

20. The digital storage medium according to claim 17, wherein the control signals include signals that permit the computer device to perform a method in which at least one of the assertion and the assumption of the property describes the behavior of the circuit as a function of time, changes in a state of the circuit being able to appear at different times, and, on appearance of the counterexample, instants at which changes in a state of the property contradicts the assertion are determined.

21. The digital storage medium according to claim 20, wherein the control signals include signals that permit the computer device to perform a method in which the determined instants together with the assumption of the property are displayed.

22. The digital storage medium according to claim 17, wherein the control signals include signals that permit the computer device to perform a method in which the determined part of the assertion that contradicts the counterexample is displayed together with the property.

23. The digital storage medium according to claim 17, wherein the control signals include signals that permit the computer device to perform a method in which evaluations of state expressions are displayed directly at a corresponding point within the property at any desired syntactical hierarchical level of properties.

24. The digital storage medium according to claim 17, wherein the control signals include signals that permit the computer device to perform a method in which at least one of the assumption and the assertion of the property comprises at least one macro in which descriptions of the behavior of the circuit are assembled.

* * * * *